United States Patent
Liu et al.

(10) Patent No.: US 9,300,270 B2
(45) Date of Patent: Mar. 29, 2016

(54) RF DEVICE AND METHOD FOR TUNING AN RF DEVICE

(75) Inventors: Zidong Liu, Dorset (GB); Klaus Reimann, Eindhoven (NL); Kevin R. Boyle, West Sussex (GB); Maurice de Jongh, Nijmegen (NL); Jeroen Bielen, Molenhoek (NL)

(73) Assignee: Qualcomm Technologies, Inc., San Diego, CA (US)

( * ) Notice: Subject to any disclaimer, the term of this patent is extended or adjusted under 35 U.S.C. 154(b) by 150 days.

(21) Appl. No.: 13/996,853

(22) PCT Filed: Dec. 23, 2010

(86) PCT No.: PCT/EP2010/070686
§ 371 (c)(1),
(2), (4) Date: Aug. 23, 2013

(87) PCT Pub. No.: WO2012/084057
PCT Pub. Date: Jun. 28, 2012

(65) Prior Publication Data
US 2013/0335168 A1    Dec. 19, 2013

(51) Int. Cl.
*H03H 7/01* (2006.01)
*H01G 5/014* (2006.01)
*H01G 5/019* (2006.01)

(52) U.S. Cl.
CPC ............. *H03H 7/0161* (2013.01); *H01G 5/014* (2013.01); *H01G 5/019* (2013.01)

(58) Field of Classification Search
CPC ...... H01G 5/014; H01G 5/019; H03H 7/0161
USPC ......................................................... 333/174
See application file for complete search history.

(56) References Cited

U.S. PATENT DOCUMENTS

| 6,474,162 | B1 | 11/2002 | Voss et al. |
| 7,659,150 | B1 | 2/2010 | Monadgemi et al. |
| 7,821,467 | B2 * | 10/2010 | Sugiyama ............... 343/745 |
| 8,928,431 | B2 * | 1/2015 | Koechlin ............... 333/174 |
| 2003/0020173 | A1 | 1/2003 | Huff et al. |
| 2004/0164905 | A1 | 8/2004 | Tran |

(Continued)

FOREIGN PATENT DOCUMENTS

| JP | H11510895 A | 9/1999 |
| JP | 2005518746 A | 6/2005 |
| JP | 2009049868 A | 3/2009 |

(Continued)

OTHER PUBLICATIONS

International Search Report—PCT/EP2010/070686—ISA/EPO—Oct. 6, 2011.

(Continued)

*Primary Examiner* — Patrick O'Neill
(74) *Attorney, Agent, or Firm* — Smith Risley Tempel Santos LLC

(57) ABSTRACT

An RF device includes a substrate and a series circuit of a tunable RF component and a DC blocking capacitor. The series circuit is arranged on the substrate and couples an RF signal terminal to a fixed voltage terminal that is electrically isolated from the RF signal terminal. The tunable RF component is coupled to the RF signal terminal, the DC blocking capacitor is coupled to the fixed voltage terminal and a driver terminal is coupled to the tunable RF component.

8 Claims, 7 Drawing Sheets

(56) References Cited

U.S. PATENT DOCUMENTS

| | | |
|---|---|---|
| 2009/0051610 A1 | 2/2009 | Sugiyama |
| 2010/0142117 A1 | 6/2010 | Shimanouchi et al. |

FOREIGN PATENT DOCUMENTS

| | | |
|---|---|---|
| JP | 2010135614 A | 6/2010 |
| WO | 9706412 A1 | 2/1997 |
| WO | 03073607 A1 | 9/2003 |
| WO | WO 2006/065693 A1 | 6/2006 |
| WO | WO 2006/129239 A1 | 12/2006 |
| WO | WO 2008/087585 A2 | 7/2008 |
| WO | WO 2010/106484 A1 | 9/2010 |

OTHER PUBLICATIONS

Meyer, R., et al., "Distortion in Variable-Capacitance Diodes," IEEE Journal of Solid-State Circuits, vol. SC-10, No. 1, Feb. 1975, pp. 47-54.

Theunis, F., et al., "A Novel and Efficient Packaging Technology for RF-MEMS Devices," Proceedings of the 57th Electronic Components and Technology Conference (ECTC '07), May 29-Jun. 1, 2007, pp. 1239-1245, Reno, Nevada.

* cited by examiner

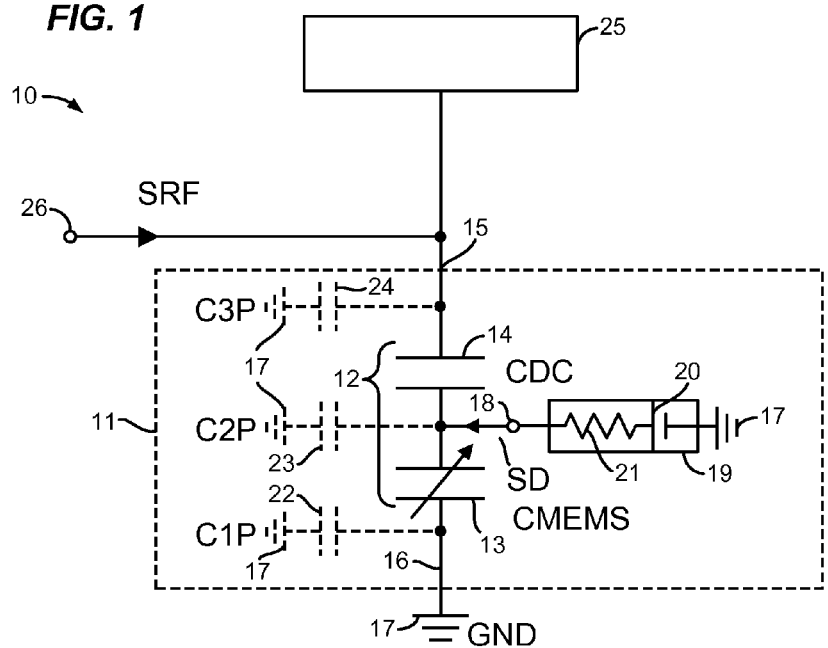
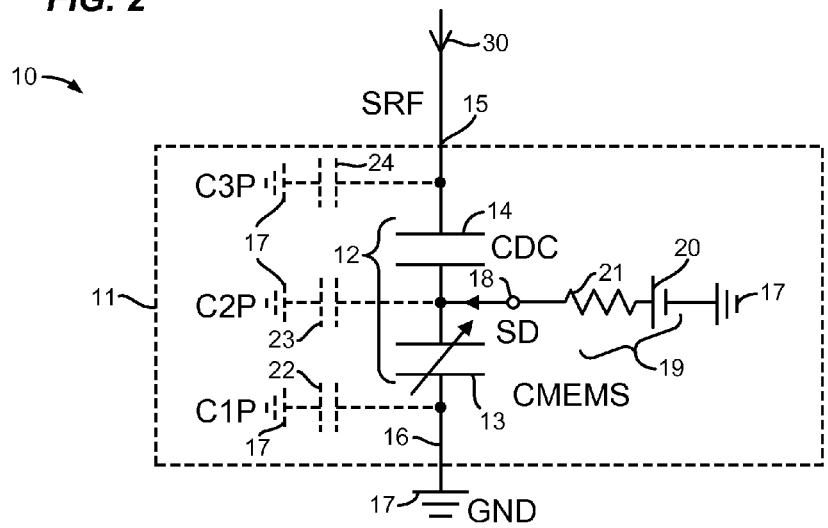

FIG. 13
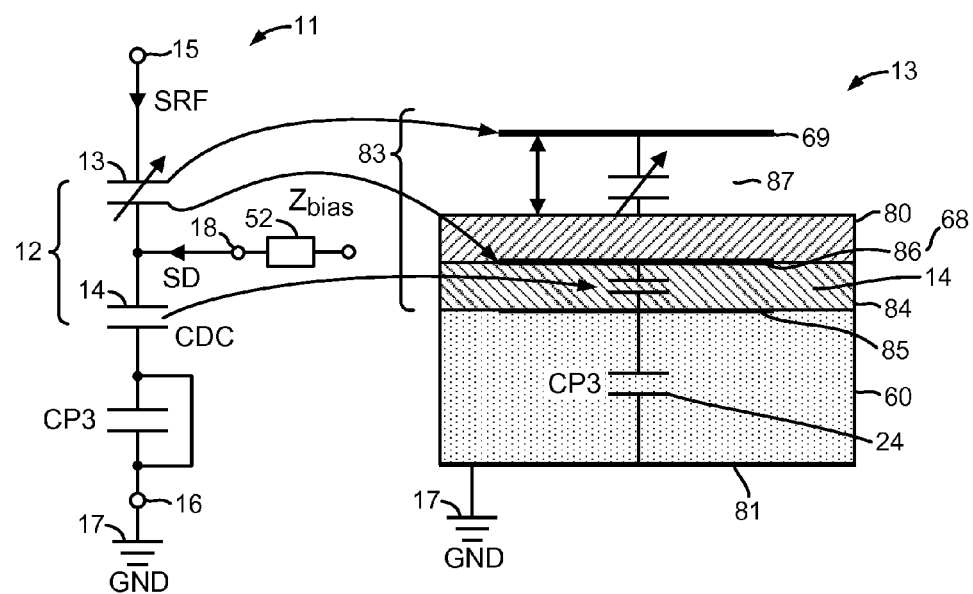
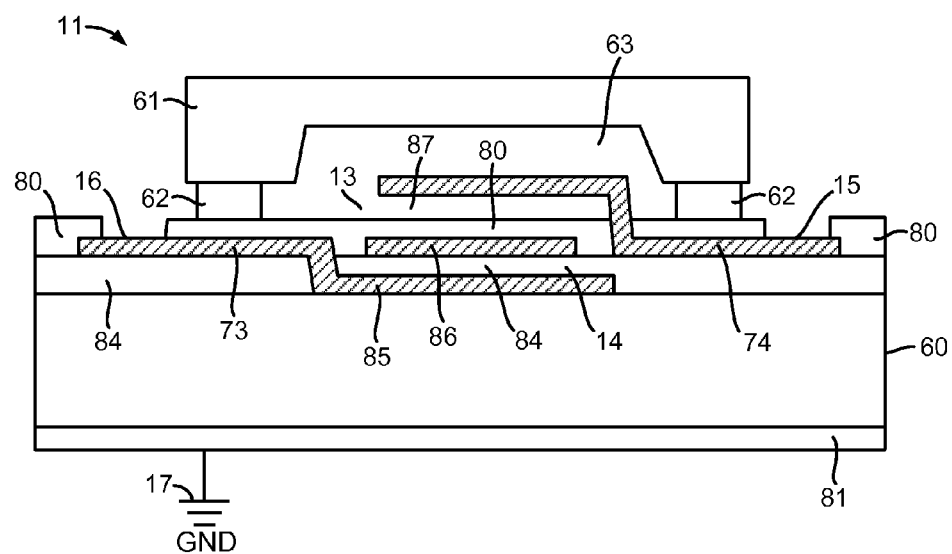

RF DEVICE AND METHOD FOR TUNING AN RF DEVICE

This patent application is a national phase filing under section 371 of PCT/EP2010/070686, filed Dec. 23, 2010, which is incorporated herein by reference in its entirety.

TECHNICAL FIELD

The present invention is related to an RF device, a system comprising an RF device and a method for tuning an RF device.

BACKGROUND

An RF device often comprises a component with a tunable capacitance value such as a varactor, a diode, or a microelectro-mechanical system capacitor, abbreviated MEMS capacitor. Such a component needs a bias voltage. Thus, a DC blocking capacitor is placed at least at one terminal of the component with the tunable capacitance value.

International Patent Publication No. WO 2006/065693 A1 refers to a slot antenna having a MEMS varactor for resonance frequency tuning.

International Patent Publication No. WO 2006/129239 A1 is related to a planar antenna assembly with impedance matching. A circuit comprises tunable capacitors which are connected in series.

Publication "Distortion in Variable-Capacitance Diodes," Robert G. Meyer, Mark L. Stevens, IEEE Journal of Solid-State Circuits, Vol. SC-10, No. 1, February 1975, pp. 47-54 describes circuits with variable capacitance diodes.

International Patent Publication No. WO 2010/106484 A1 is related to a bond frame integrated in electronic circuits. The closed bond frame forms an inductive element. Moreover, a series circuit of a MEMS capacitor and a further capacitor couples two areas of the bond frame. A terminal of the MEMS capacitor is electrically connected to a first area of the bond frame and a terminal of the further capacitor is electrically connected to another area of the bond frame.

In International Patent Publication No. WO 2008/087585 A2, a MEMS system is described which comprises a capacitor switch array. The capacitor switch array comprises series circuits of a capacitor and a MEMS switch. The capacitance value of the capacitor switch array is tuned by setting the MEMS switches in an open or a closed state.

SUMMARY OF THE INVENTION

Embodiments of the invention provide an RF device, a system comprising an RF device and a method for tuning an RF device which reduces the parasitic effects from the DC blocking capacitor.

An RF device comprises a substrate and a series circuit of a tunable RF component and a DC blocking capacitor. The series circuit of the tunable RF component and the DC blocking capacitor is arranged on the substrate and couples an RF signal terminal to a fixed voltage terminal. The fixed voltage terminal is electrically isolated from the RF signal terminal. The tunable RF component is coupled to the RF signal terminal. The DC blocking capacitor is coupled to the fixed voltage terminal. Moreover, a driver terminal is coupled to the tunable RF component.

Since the DC blocking capacitor is connected to the fixed voltage terminal, parasitic effects from the DC blocking capacitors such as parasitic capacitors have constant values which results in a reduced influence of the parasitic effects on the RF device. The RF device has a lower capacitance value and a higher capacitance ratio when the tunable RF component is tuned between its minimum and its maximum capacitance value and is connected to the RF signal terminal.

In an embodiment, the driver terminal is coupled to a node between the tunable RF component and the DC blocking capacitor.

In an alternative embodiment, the driver terminal is coupled to a control terminal of the tunable RF component.

In an embodiment, a reference potential terminal is coupled to the RF signal terminal such that the reference potential terminal is DC grounded. The RF signal terminal is, for example, connected to the reference potential terminal via a component or a circuit which allow a DC current flow between the RF signal terminal and the reference potential terminal. The RF signal terminal can be connected to the reference potential terminal via an antenna, an inductor or a resistor. Thus, the DC voltage across the tunable RF component is only influenced by a driver signal at the driver terminal. Only an AC voltage signal and no DC voltage can be tapped off at the RF signal terminal with reference to the reference potential terminal. Thus, no DC voltage change at the RF signal terminal influences the capacitance value of the tunable RF component. A co-design of a biased tunable impedance device and RF components is performed. One or more of the RF components which are connected to the RF device are DC grounded. The DC-ground enables the RF device to be connected directly with the RF components.

In an embodiment, the reference potential terminal is coupled to the fixed voltage terminal. Thus, the fixed voltage terminal and the RF signal terminal are both DC grounded, but only the fixed voltage terminal is AC grounded. The reference potential terminal provides a ground potential. The fixed voltage terminal has the ground potential. A RF input signal is provided to the RF signal terminal. The voltage of the RF input signal is different from the ground potential.

In an embodiment, the substrate is a semiconductor substrate. Preferably, the substrate is a silicon substrate. The substrate can be a silicon wafer or a silicon chip. Preferably, the substrate comprises a single crystal of the semiconductor.

In an embodiment, the tunable RF component is one of a group comprising a varactor diode, a PIN diode, a MEMS capacitor such as a capacitor with a moveable capacitor electrode, a capacitor with a tunable dielectric layer such as a ferroelectric layer, a galvanic MEMS component such as a micro relay and a p-channel high-electron-mobility transistor, abbreviated pHEMT. PIN diode is the abbreviation for a positively-doped/intrinsic/negatively-doped diode. The varactor diode, the PIN diode, the MEMS capacitor and the capacitor with the tunable dielectric layer obtain a spectrum of capacitance values between a minimum capacitance value and a maximum capacitance value depending on the driver signal. The galvanic MEMS component has an open and a closed state such that the series circuit of the tunable RF component and the DC blocking capacitor either show the capacitance value of the blocking capacitor or an approximately zero capacitance value.

In an embodiment, the RF device comprises a cap and a bond frame. The bond frame connects the cap to a first surface of the substrate. A cavity is enclosed by the cap and the substrate. The cavity can be filled with a gas, such as air. The tunable RF component and the DC blocking capacitor can be arranged inside the cavity on the first surface of the substrate. Thus, the cap encapsulates the substrate such that the influence of disturbances on the tunable RF component and the DC blocking capacitor are reduced.

In an embodiment, a system comprises the RF device and an antenna which is coupled to the RF signal terminal.

In a further development, the antenna is DC grounded or a connection line between the RF signal terminal and the antenna is DC grounded. By the DC grounding, a conductive path couples the RF signal terminal to the reference potential terminal.

Therefore, the driver signal controls the DC voltage across the tunable RF component such that the capacitance value of the tunable RF component is set.

In an embodiment, the system is applied in a mobile phone, a portable device, an RFID reader or a miniaturized, adaptive RF module.

In an embodiment, a method for tuning an RF device comprises providing an RF input signal that is DC grounded to an RF signal terminal and providing a ground potential to a fixed voltage terminal. A series circuit of a tunable RF component and a DC blocking capacitor is arranged on a substrate and couples the RF signal terminal to the fixed voltage terminal. The fixed voltage terminal is electrically isolated from the RF signal terminal. The tunable RF component is coupled to the RF signal terminal. The DC blocking capacitor is coupled to the fixed voltage terminal. A driver signal controls the tunable RF component.

In an embodiment, the RF input signal is DC grounded by a resistive or an inductive connection of the RF signal terminal to a reference potential terminal. The ground potential is provided at the reference potential terminal. Preferably, the RF signal terminal is not AC grounded. The RF input signal is different from the ground potential. The RF input signal is free of a DC voltage.

BRIEF DESCRIPTION OF THE DRAWINGS

The following description of figures of exemplary embodiments may further illustrate and explain the invention. Circuits, devices and components with the same structure and the same effect, respectively, appear with equivalent reference symbols. In so far as circuits, devices or components correspond to one another in terms of their function in different figures, the description thereof is not repeated for each of the following figures.

FIGS. 1 to 8 show exemplary embodiments of a system comprising an RF device; and FIGS. 9 to 13 show exemplary embodiments of an RF device.

DETAILED DESCRIPTION OF ILLUSTRATIVE EMBODIMENTS

Figure 3:
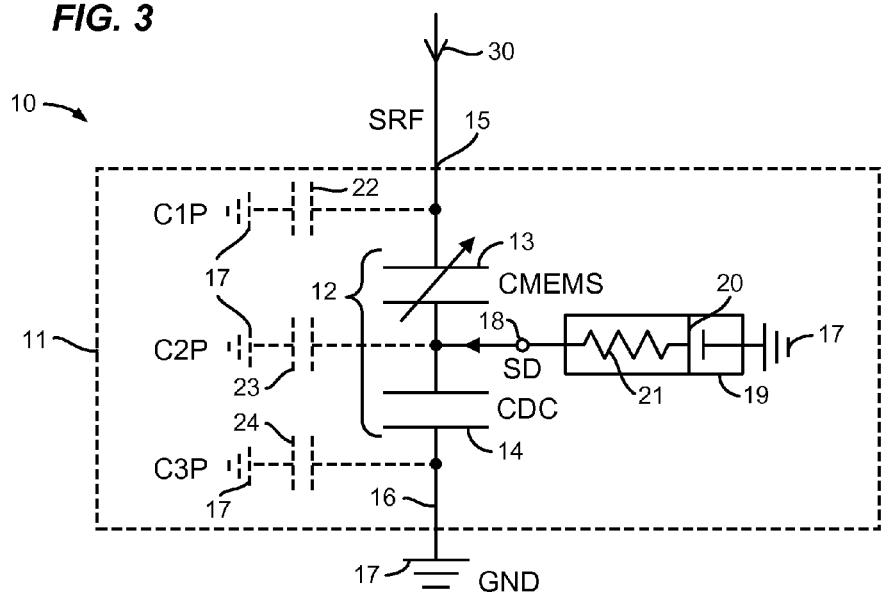

FIG. 1 shows an exemplary embodiment of a system 10 comprising an RF device 11. The RF device 11 comprises a series circuit 12 having a tunable RF component 13 and a DC blocking capacitor 14. Moreover, the RF device 11 has an RF signal terminal 15 and a fixed voltage terminal 16. The fixed voltage terminal 16 is directly and permanently connected to a reference potential terminal 17. The fixed voltage terminal 16 is alternatively connected to a supply voltage terminal. A terminal of the tunable RF component 13 is connected to the fixed voltage terminal 16. Correspondingly, a terminal of the DC blocking capacitor 14 is connected to the RF signal terminal 15.

Moreover, the RF device 11 comprises a driver terminal 18 which is connected to a node between the tunable RF component 13 and the DC blocking capacitor 14. A driver circuit 19 is connected to the driver terminal 18. The driver circuit 19 comprises a series connection of a voltage source 20 and a resistor 21. The driver circuit 19 is connected between the driver terminal 18 and the reference potential terminal 17. The driver circuit 19 is designed as a DC bias circuit. A first parasitic capacitor 22 is arranged between the reference potential terminal 17 and a node between the tunable RF component 13 and the fixed voltage terminal 16. A second parasitic capacitor 23 connects the reference potential terminal 17 to the node between the tunable RF component 13 and the DC blocking capacitor 14. Moreover, a third parasitic capacitor 24 couples the reference potential terminal 17 to a node between the DC blocking capacitor 14 and the RF signal terminal 15.

The system 10 further comprises a RF circuit 25 having further RF components. The RF circuit 25 is connected to the RF signal terminal 15. Moreover, an RF input terminal 26 is connected to a node between the RF circuit 25 and the RF signal terminal 15. The dashed rectangular line indicates the package of the RF device 11.

The RF device 11 provides a tunable capacitance value. An RF input signal SRF can be tapped at the RF input terminal 26. The RF input signal SRF is applied to the RF circuit 25 and to the RF signal terminal 15. The driver circuit 19 feds a driver signal SD to the driver terminal 18. Thus, the driver signal SD is provided across the tunable RF component 13 and sets the DC voltage across the tunable RF component 13. By means of the DC voltage across the tunable RF component 13, the capacitance value of the tunable RF component 13 is determined. The DC blocking capacitor 14 blocks a DC current from the RF signal terminal 15 to the tunable RF component 13. The overall capacitance value CS of the series circuit 12 can be calculated according to the following equation, if the parasitic capacitors 22, 23, 24 are neglected:

$$CS = \frac{CMEMS \cdot CDC}{CMEMS + CDC} \quad (1)$$

wherein CMEMS is the capacitance value of the tunable RF component 13 and CDC is the capacitance value of the DC blocking capacitor 14. Since the capacitance value CMEMS is smaller than the capacitance value CDC, the capacitance value CS of the series circuit 12 is approximately equal to the capacitance value CMEMS of the tunable RF component 13.

If the parasitic capacitors 22, 23, 24 are not neglected, the capacitance value CS of the series circuit 12 can be calculated according to the following equations:

$$CS = \frac{1}{\left(\frac{1}{C2P + CMEMS} + \frac{1}{CEC}\right)} + C3P \approx CMEMS + C2P + C3P$$

wherein C2P is the capacitance value of the second parasitic capacitor 23 and C3P is the capacitance value of the third parasitic capacitor 24.

In the "closed" state, the tunable RF component 13 obtains a high capacitance value, whereas in an "open" state, the tunable RF component 13 obtains a low capacitance value. The capacitance ratio between the "close" and "open" states for the series circuit 12 shown in FIG. 1 is $$\text{Ratio} = \frac{CMEMS\_C + C2P + C3P}{CMEMS\_O + C2P + C3P} \approx \frac{CMEMS\_C}{CMEMS\_O + C2P + C3P}$$

wherein CMEMS_C is the capacitance value of the tunable RF component 13 in the "closed" state and CMEMS_O is the capacitance value of the tunable RF component 13 in the "open" state. FIG. 1 shows a typical configuration for a shunted RF device 11, wherein only one port of the RF device 11 needs biasing. The RF device 11 can be named as a MEMS switch.

RF components are usually not DC-grounded and the DC voltage on RF components might differ from application to application. A general-purpose RF device therefore best provides floating connections. This means that for devices that need a bias voltage, such as MEMS or varactor diodes, a DC blocking capacitor 14 is placed at the connections of the device. In the most versatile configuration this means that each port of the device needs a DC blocking capacitor 14 and a bias circuit to set the appropriate voltage level. Each bias circuit and blocking capacitor 14 causes losses and adds parasitic impedances.

FIG. 2 shows a further exemplary embodiment of the system 10. The system 10 comprises an antenna 30 that is connected to the RF signal terminal 15. The system 10 is a MEMS-switched antenna arrangement.

FIG. 3 shows an exemplary embodiment of the system 10 according to the principle presented. The system 10 shown in FIG. 3 is a further development of the system shown in FIGS. 1 and 2. The series circuit 12 is arranged in such a way that a terminal of the tunable RF component 13 is connected to the RF signal terminal 15 and a terminal of the DC blocking capacitor 14 is connected to the fixed voltage terminal 16. The tunable RF component 13 is an adjustable RF component or a variable RF component. The tunable RF component 13 is realized as tunable capacitor. The antenna 30 is connected to the RF signal terminal 15. The RF device 11 is implemented as a MEMS device.

The antenna 30 is implemented such that a DC ground potential is applied by the antenna 30 to the RF signal terminal 15. The driver circuit 19 is connected between the driver terminal 18 and the reference potential terminal 17. Since a DC ground potential is applied to the RF signal terminal 15, the driver signal SD can set the DC voltage between the first and the second terminal of the tunable RF component 13. Thus, the capacitance value of the tunable RF component 13 is solely controlled by the driver signal SD and not by the RF input signal SRF. The first parasitic capacitor 22 couples a node between the tunable RF component 13 and the RF signal terminal 15 to the reference potential terminal 17. Moreover, the third parasitic capacitor 24 connects the reference potential terminal 17 to a node between the DC blocking capacitor 14 and the fixed voltage terminal 15. Thus, the three parasitic capacitors 22, 23, 24 are located at the same terminals of the tunable RF component 13 and the DC blocking capacitor 14 such as in FIGS. 1 and 2.

The capacitance value CS of the series circuit 12 can be calculated according to the following equations:

$$CS = \cfrac{1}{\left(\cfrac{1}{C2P+CDC}+\cfrac{1}{CMEMS}\right)} + C1P \approx \cfrac{1}{\left(\cfrac{1}{CDC}+\cfrac{1}{CMEMS}\right)} + C1P$$

$$CS \approx CMEMS + C1P,$$

wherein CDC is the capacitance value of the DC blocking capacitor 14, CMEMS is the capacitance value of the tunable RF component 13, C1P is the capacitance value of the first parasitic capacitor 22 and C2P is the capacitance value of the second parasitic capacitor 23.

The capacitance ratio between the "close" and "open" states for the series circuit 12 shown in FIG. 3 is:

$$\text{Ratio} = \cfrac{CMEMS\_C + C1P}{CMEMS\_O + C1P} \approx \cfrac{CMEMS\_C}{CMEMS\_O + C1P}$$

If the sum of the capacitance values C2P and C3P is larger than the capacitance value C1P, then the capacitance value CS of the RF device 11 according to FIG. 3 is smaller than the capacitance value CS of the RF device 11 according to FIG. 1. Further on, the capacitance ratio of the RF device 11 of FIG. 3 is larger than the capacitance ratio of the RF device 11 according to FIG. 1. This is, for example, the case if the DC blocking capacitor 14 adds a lot of parasitic effects or the capacitance value C2P is not smaller than the capacitance value C1P.

According to FIG. 3, the RF device 11 is directly connected with the DC-grounded antenna 30. The system 10 not only minimizes the parasitic effects from the DC blocking capacitor 14, but also reduces loss into the DC bias resistor 21. In FIG. 3, a co-design of a biased tunable impedance device such as the RF device 11 and RF components such as the antenna 30 is described. By means of the antenna 30 that is DC grounded, the system 10 is optimized. The advantages of the RF device 11 according to FIG. 3 in comparison to the RF device 11 of FIG. 1 are: The RF device 11 in FIG. 3 has lower loss, i.e., higher quality factor. The RF device 11 in FIG. 3 provides a lower minimum capacitance. Moreover, the RF device 11 in FIG. 3 has a higher capacitance ratio between the "close" and "open" states.

In FIGS. 3 to 13, a co-design of the RF device 11 that can be implemented as MEMS device and RF components such as the RF circuit 25 and the antenna 30 is described. The RF device 11 is in shunt with the DC-grounded antenna 30 that means in a parallel circuit with the antenna 30. The RF device 11 comprises the tunable RF component 13, a silicon die and a package that seals the MEMS from humidity and other detrimental ambient influences as shown, for example, in FIGS. 9 and 13.

Advantageously, the bias feed point that is the driver terminal 18 has a lower RF voltage value due to the voltage division between the tunable RF component 13 and the DC blocking capacitor 14, and hence dissipates less power that means loss into the bias resistor 21.

In an alternative embodiment, the tunable RF component 13 can be implemented as a RF switch. The RF switch can be designed as a RF MEMS switch. The RF MEMS switch can be realized as a micro relay. In this case, the driver circuit 19 is connected to a control terminal of the tunable RF component 13 and not to the node between the tunable RF component 13 and the DC blocking capacitor 14. The MEMS switch has a DC-ground at the RF input port 15. The RF MEMS switch is an example for a galvanic MEMS component. Alternatively, the tunable RF component 13 can comprise a varactor diode, a PIN diode, a capacitor with a tunable dielectric layer such as a ferroelectric layer or a pHEMT.

Figure 4:
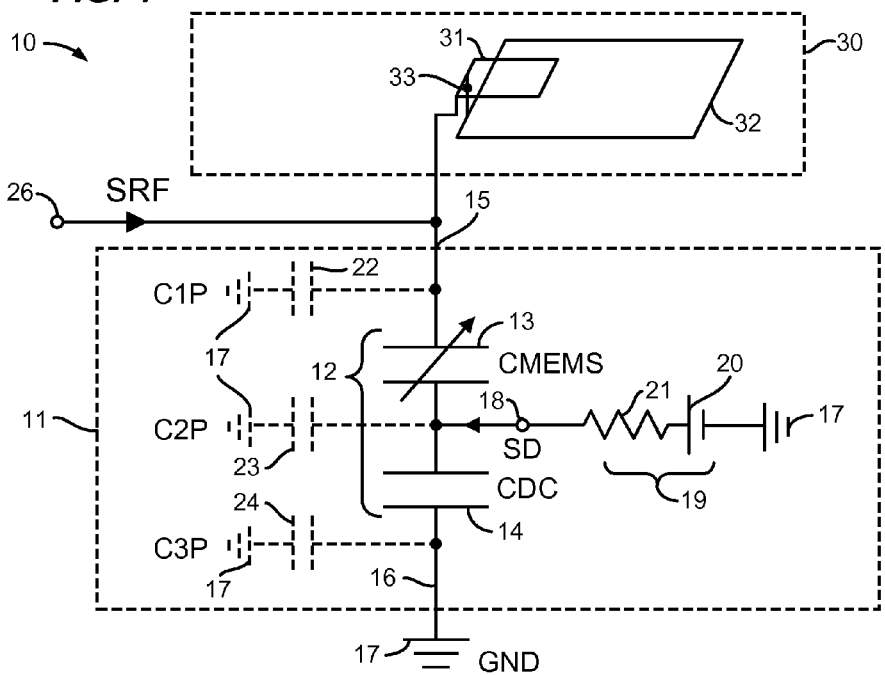

FIG. 4 shows a further exemplary embodiment of the system according to the principle presented. The system 10 of FIG. 4 is a further development of the system explained by FIGS. 1 to 3. The antenna 30 is realized as a micro-strip antenna. The antenna 30 is implemented as a planar inverted F-antenna, abbreviated PIFA. The antenna 30 comprises a conducting line 31 which is arranged on a printed circuit board 32, abbreviated PCB. The antenna 30 comprises a pin 33 which is coupled to a reference potential terminal of the PCB 32. The pin 33 of the antenna 30 is designed as a shorting pin. Thus, the antenna 30 is realized as a DC grounded antenna. FIG. 4 illustrates a co-design of a MEMS device and RF components.

Figure 5:
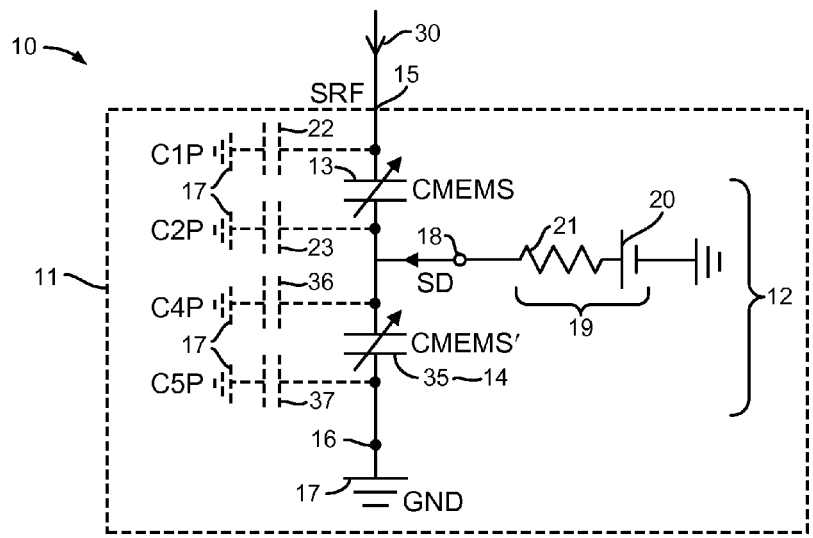

FIG. 5 shows a further exemplary embodiment of the system according to the principle presented. The system 10 depicted in FIG. 5 is a further development of the system shown in FIGS. 1 to 4. The DC blocking capacitor 14 is realized as an additional tunable RF component 35. The additional tunable RF component 35 is designed such that it operates as a DC blocking capacitor. Thus, the driver signal SD is applied to the tunable RF component 13 and to the additional tunable RF component 35. Since both capacitors 13, 35 of the series circuit 12 are tunable, the capacitance ratio is further increased. The antenna 30 acts as an RF component with a DC ground. The RF device 11 is realized as an RF MEMS matrix. The RF MEMS matrix is a MEMS matrix in series.

Figure 6:
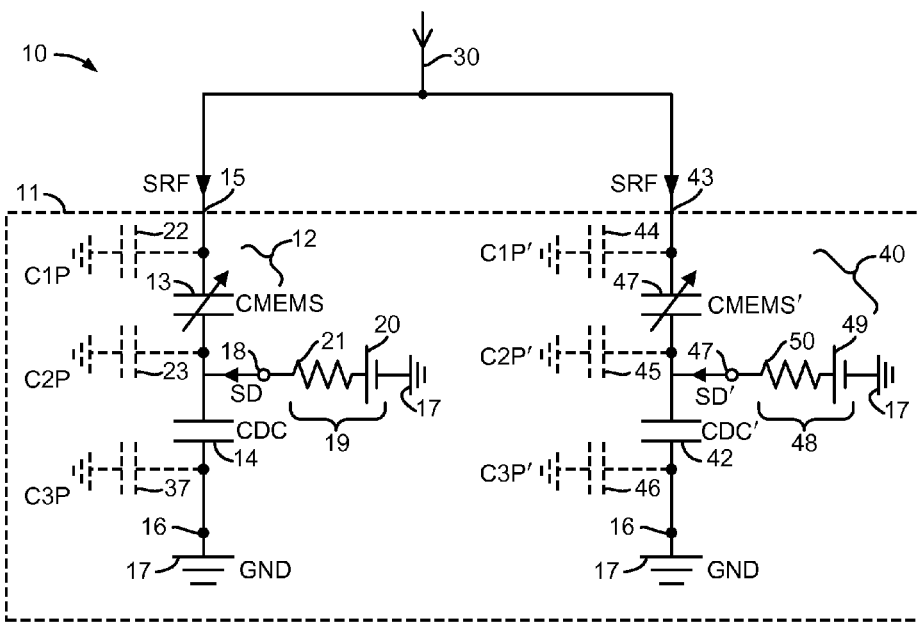

FIG. 6 shows a further exemplary embodiment of the system according to the principle presented. The system 10 of FIG. 6 is a further development of the system described by FIGS. 1 to 5. The RF device 11 additionally comprises a further series circuit 40 which comprises a further tunable RF component 41 and a further DC blocking capacitor 42. The further DC blocking capacitor 42 is connected to the fixed voltage terminal 16. A further RF signal terminal 43 of the RF device 11 is connected to the further tunable RF component 41. A conducting line of the system 10 connects the RF signal terminal 15 to the further RF signal terminal 43.

The RF device 11 is realized as an RF MEMS matrix. The antenna 30 is an example for an RF component with a DC ground. The further series circuit 40 obtains a further first, a further second and a further third parasitic capacitor 44 to 46. Moreover, a further driver terminal 47 is connected to a node between the further tunable RF component 41 and the further DC blocking capacitor 42. A further driver circuit 48 couples the further driver terminal 47 to the reference potential terminal 17 and comprises a further voltage source 49 and a further resistor 50. The RF device 11 comprises a MEMS matrix in parallel. The DC bias ports 18, 47 can control each MEMS switch or variable capacitor individually. The RF device 11 can be formed as a MEMS matrix that includes more than one MEMS switch in series or in parallel, as shown in FIGS. 5 and 6.

In an alternative, not shown embodiment, the further series circuit 40 is arranged between the RF signal terminal 15 and the fixed voltage terminal 16. Thus, the series circuit 12 and the further series circuit 40 are connected inside the RF device 11. The further RF signal terminal 43 can be omitted.

In an alternative, not shown embodiment, the driver circuit 19 and the further driver circuit 48 are realized at least partially outside of the RF device 11.

Figure 7:
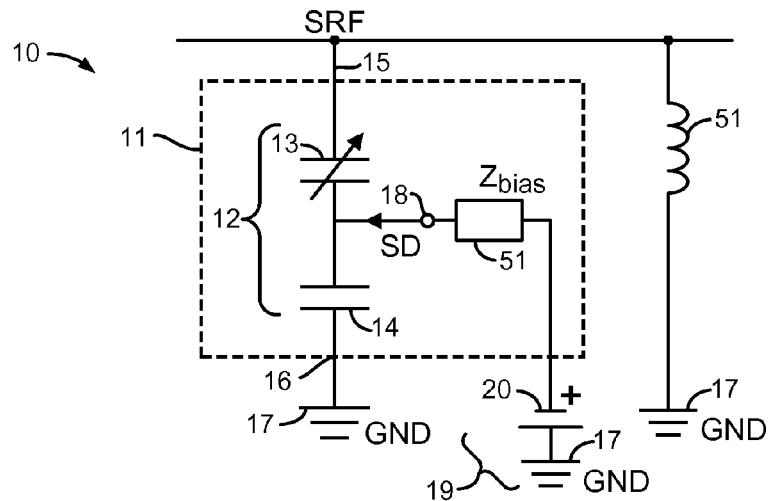

FIG. 7 shows a further exemplary embodiment of a system according to the principle presented that is a further development of the system shown in FIGS. 1 to 6. The system 10 comprises an inductor 51 that is connected between the RF signal terminal 15 and the reference potential terminal 17. The inductor 51 is formed as a coil. The system 10 is realized as a bandpass filter. The bandpass filter has a first order. The system 10 can be integrated in a TV tuner. The driver circuit 19 is realized partly on the RF device 11 and partly in the system 10 outside of the RF device 11. The RF device 11 comprises an impedance 52 which is arranged inside the RF device 11. The system 10 comprises the voltage source 20. The voltage source 20 is realized outside of the RF device 11.

Thus, the driver circuit 19 comprises the impedance 52 and the voltage source 20. The inductor 51 provides a DC grounding of the RF terminal 15.

In an alternative, not shown embodiment, the antenna 30 is connected to the RF terminal 15. The antenna 30 is grounded. In a further development, the antenna 30 replaces the inductor 51.

Figure 8:
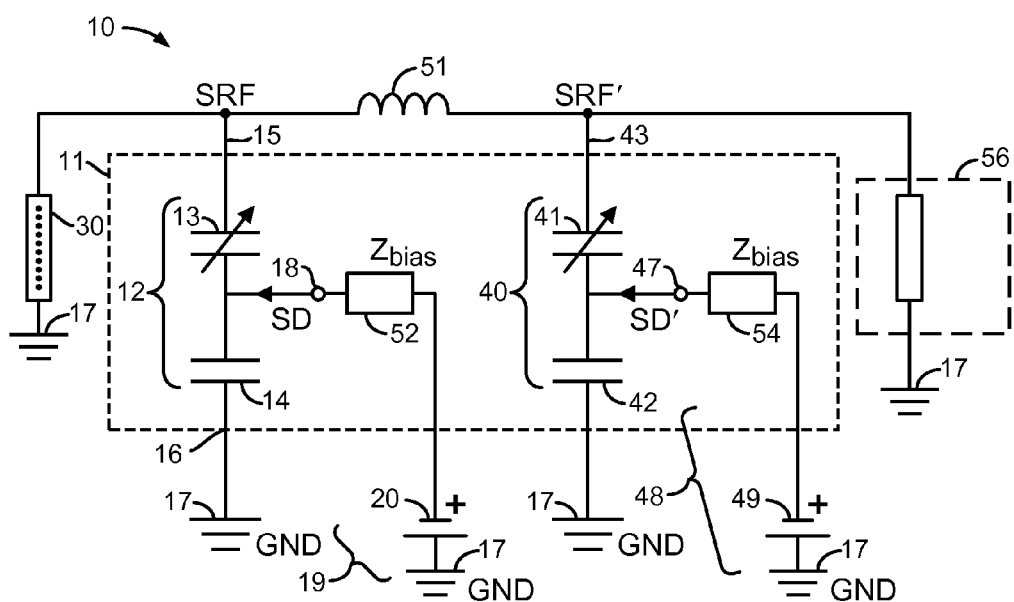

FIG. 8 shows a further exemplary embodiment according to the principle presented. The system 10 shown in FIG. 8 is a further development of the system shown in FIGS. 1 to 7. The RF device 11 comprises the series circuit 12 and the further series circuit 40 is shown in FIG. 6. Moreover, the further driver circuit 48 comprises a further impedance 54 and the further voltage source 49. The further impedance 54 is realized inside the RF device 11. The further voltage source 49 is realized on the system 10 outside of the RF device 11. Moreover, the inductor 51 couples the RF signal terminal 15 to the further RF signal terminal 43. The antenna 30 is connected to the RF signal terminal 15. The antenna 30 couples the RF signal terminal 15 to the reference potential terminal 17. A transceiver circuit 56 is connected to the further RF signal terminal 43. In FIG. 8, a substitute resistance is shown for the transceiver circuit 56.

The system 10 comprises a matching circuit, whereas the antenna 30 and the inductor 51 provide a DC ground. The proposed principle can also be used for MEMS-switched RF filters or MEMS-switched impedance matching networks or any MEMS-switched circuit, provided that a DC-ground naturally exists at the RF signal terminal 15 of the RF device 11 in shunt. The tunable RF component 13 can be a single MEMS capacitor or a MEMS capacitor array. The RF device 11 can be fabricated in one package or in several packages.

In an alternative, not shown embodiment, a further RF device comprises the further series circuit 40. Thus, the series circuit 12 and the further series circuit 40 are separated in two RF devices each having its package.

Figure 9:
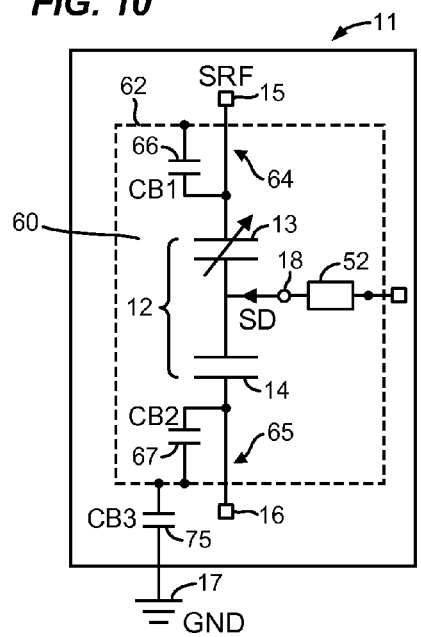

FIG. 9 shows an exemplary embodiment of the RF device according to the principle presented. The RF device 11 shown in FIG. 9 is a further development of the RF device 11 shown in FIGS. 1 to 8. The RF device 11 comprises a substrate 60. Moreover, the RF device 11 comprises a cap 61 and a bond frame 62. The cap 61 is coupled to the substrate 60 via the bond frame 62. The bond frame 62 provides a hermetic seal of a cavity 63 between the cap 61 and the substrate 60. The cap 61 is fixed to a first surface of the substrate 60.

Furthermore, the RF device 11 comprises a first and a second feed-through 64, 65. The first feed-through 64 connects the RF signal terminal 15 to a first terminal of the tunable RF component 13. Similarly, the second feed-through 65 connects the fixed voltage terminal 16 to a first terminal of the DC blocking capacitor 14. A first feed-through capacitor 66 couples the first terminal of the tunable RF component 13 to the bond frame 62. Similarly, a second feed-through capacitor 67 couples the first terminal of the DC blocking capacitor 14 to the bond frame 62. The bond frame 62 is connected to the reference potential terminal 17. Thus, the bond frame 62 is grounded. The first and the second feed-through capacitors 66, 67 are parasitic capacitors having capacitance values CB1, CB2, respectively.

A cross-section of the RF device 11 is shown on the right side of FIG. 9. The substrate 60 is a silicon substrate. The silicon is off high resistivity. The cap 61 is a silicon micromachined cap. The bond frame 62 comprises a eutectic compound or an AuSn solder. The tunable RF component 13 and the DC blocking capacitor 14 are located on the first surface of the substrate 60. The DC blocking capacitor 14 is realized as a metal-insulator-metal capacitor, abbreviated MIM capacitor. The DC blocking capacitor 14 is thus implemented as a parallel plate capacitor.

The tunable RF component 13 comprises a first and a second electrode 68, 69 which are fabricated as a fixed and a moving electrode. The driver signal SD changes the distance between the first electrode 68 and the second electrode 69. Thus, the capacitance value of the tunable RF component 13 is controlled. A first and a second dielectric layer 70, 71 are deposited on the substrate 60. The first feed-through 64 comprises a first conducting line 73 between the first and the second dielectric layer 70, 71 which connects one of the electrodes of the tunable RF component 13 to the RF signal terminal 15. Similarly, a second conducting line 74 connects the first terminal of the DC blocking capacitor 14 to the fixed voltage terminal 16. The first and the second conducting lines 73, 74 are electrically isolated from the bond frame 62. The second dielectric layer 71 provides the electric isolation from the first and the second conducting lines 73, 74 to the bond frame 62.

A silicon die comprises the substrate 60, the tunable RF component 13 and the DC blocking capacitor 14. The cap 61 and the bond frame 62 form a package that seals the silicon die and mainly the tunable RF component 13 from the humidity and gas pressure of the ambient gas. The bond frame 62 is grounded to avoid cross-coupling between several signals.

In an alternative, not shown embodiment, the RF device 11 further comprises a third feed-through. Thus, the driver terminal 18 can be connected from outside of the RF device 11. The voltage source 20 of the driver circuit 19 is coupled via the third feed-through to the impedance 52 of the driver circuit 19.

Figure 10:
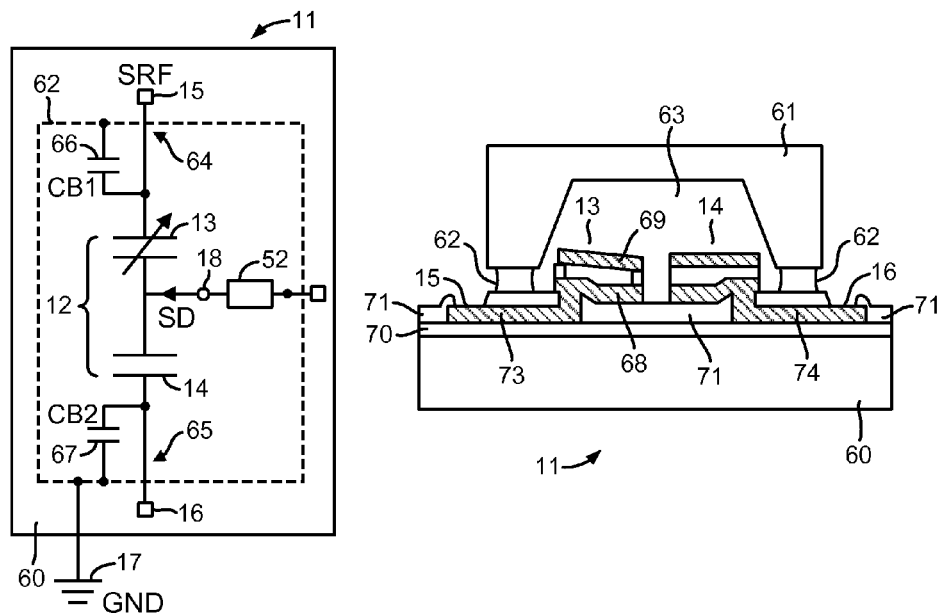

FIG. 10 shows a further exemplary embodiment of an RF device according to the principle presented. The RF device 11 shown in FIG. 10 is a further development of the RF device 11 shown in FIGS. 1 to 9. The bond frame 62 is realized as a floating bond frame. The bond frame 62 is not electrically connected to the reference potential terminal 17 or to the RF signal terminal 15 or to the fixed voltage terminal 16. The RF device 11 comprises a bond frame capacitor 75 which connects the bond frame 62 to the reference potential terminal 17. The bond frame capacitor 75 preferably can be a parasitic capacitor.

Some RF devices, notably the MEMS devices or components need hermetic packaging. A sealing can be achieved by bonding a top substrate with a cavity on the device. A metallic seal ring can be used at lower bonding temperatures and achieves a good hermeticity. The cap 61 and the bond frame 62 cause the first and the second parasitic feed-through capacitors 66, 67 having the capacitance values CB1 and CB2 of the signal lines to the bond ring 62, as shown in FIGS. 9 and 10.

Leaving the bond frame 62 floating means that a parasitic bond frame capacitor 75 having a capacitance value CB3 of the bond frame 62 to the reference potential terminal 17 becomes visible, but at the same time the effective capacitance at the two RF ports, which are the RF signal terminal 15 and the fixed voltage terminal 16, becomes lower. The effective capacitance is then a series connection in various combinations of CB1, CB2 and CB3. For example, if the fixed voltage terminal 16 is set to the ground potential GND, the effective parasitic capacitance CEFF to ground at the RF signal terminal 15 can be calculated according to the following equation:

$$CEFF = \frac{1}{\frac{1}{CB1} + \frac{1}{CB2 + CB3}}$$

Thus, the value CEFF is lower than the capacitance value CB1 of the capacitor 66. Advantageously, parasitic effects are reduced by co-designing the system 10 together with the RF device 11. The floating bond frame 62 is advantageously suited for shunt configurations where cross-coupling is less a concern. In some applications, for example, if there is only one RF function per package, then a co-design of the package and the board on which the RF device 11 is arranged as well as the surrounding is advantageously performed.

Figure 11:
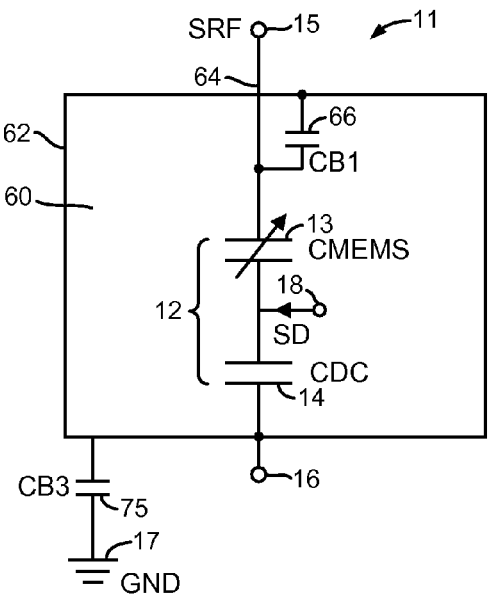

FIG. 11 shows a further exemplary embodiment of an RF device according to the principle presented. The RF device 11 illustrated in FIG. 11 is a further development of the RF device 11 depicted in FIGS. 1 to 10. The RF device 11 comprises the first feed-through 64. The first feed-through 64 is realized as a bond frame crossing. The second feed-through 65 is omitted. Instead, the bond frame 62 is connected to the fixed voltage terminal 16. Thus, the bond frame 62 is used as an RF feed at one side of the RF device 11.

Thus, the metal of the bond frame 62 is applied as a feedline into the package. This can be used for parallel arrays and series arrays in one package. The fixed voltage terminal 16 is connected directly to the bond frame 62 and the metal of the bond frame 62 extends into the package and is connected to the top metal of the MEMS/MIM devices. The series losses in this connection are substantially reduced and, therefore, the quality-factor of the RF device 11 becomes higher. In parallel array cases, the ground potential GND is connected to the fixed voltage terminal 16 as well and the bond frame capacitor 75 that is a parasitic capacitor is shorted. FIG. 11 illustrates a further exemplary co-design of MEMS device and RF components.

Figure 12:
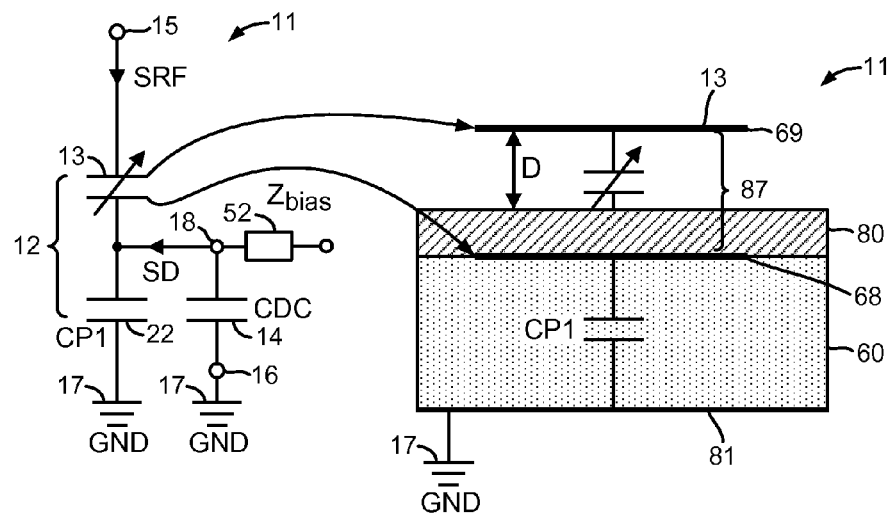

FIG. 12 shows a further exemplary embodiment of an RF device according to the principle presented. The RF device 11 of FIG. 12 is a further development of the RF device 11 of FIGS. 1 to 11. The tunable RF component 13 comprises the first electrode 68 which is realized as a fixed button electrode. The first electrode 68 is arranged on the substrate 60. The second electrode 69 of the tunable RF component 13 is realized as a moving electrode. An isolator 80 is deposited on the first electrode 68. The isolator 80 fills only a part of a gap 87 between the first and the second electrode 68, 69. The second electrode 69 is designed such that the second electrode 69 can move towards and away from the isolator 80. The gap 87 between the first and the second electrode 68, 69 is realized at least partially as an air gap. The second electrode 69 has a distance D to the isolator 80. The first parasitic capacitor 22 results from the capacitance of the first electrode 68 to the backside of the substrate 60. The backside of the substrate 60 is covered by a metal layer 81. The metal layer 81 is connected to the reference potential terminal 17. Furthermore, the RF device 11 comprises the DC blocking capacitor 14. Thus, the DC blocking capacitor 14 is connected in parallel to the first parasitic capacitor 22. Thus, the capacitance value CP1 of the first parasitic capacitor 22 is incorporated into the capacitance value CDC of the DC blocking capacitor 14.

The tunable RF component 13 that is a configurable element is most likely asymmetric in its vertical construction. A good example is a planar capacitor, which in the MEMS case would provide a higher capacitance density than symmetric, interdigitated capacitors. An asymmetric device has also different parasitic capacitances at its terminals. It therefore matters in which "polarity" the device is connected. The terminal with the higher parasitic capacitance, typically the first electrode 68, which is the bottom electrode, should be connected towards the ground or DC blocking capacitor 14 to avoid leakage of the RF signal through this parasitic capacitor. FIG. 12 shows a cross-section of the tunable RF component 13 that is a MEMS capacitor and the preferred connection in a shunt configuration. Thus, a good RF performance is achieved.

FIG. 13 shows a further exemplary embodiment of the RF device according to the principle presented. The RF device 11 shown in FIG. 13 is a further development of the RF device 11 shown in FIGS. 1 to 12. The tunable RF component 13 and the DC blocking capacitor 14 form a stack 83. The stack 83 is realized on the first surface of the substrate 60. The DC blocking capacitor 14 is arranged between the tunable RF component 13 and the substrate 60. Thus, the area of the substrate 60 is very efficiently used. A first electrode 85 of the DC blocking capacitor 14 is arranged on the substrate 60. The substrate 60 is realized as a dielectric material. The substrate 60 is a PCB or a ceramic such as a high temperature co-fired ceramic or a low temperature co-fired ceramic. A further isolator 84 is deposited on the first electrode 85 of the DC blocking capacitor 14. A second electrode 86 of the DC blocking capacitor 14 is arranged on the further isolator 84. The isolator 80 is deposited on the second electrode 86 of the DC blocking capacitor 14. The second electrode 86 of the DC blocking capacitor 14 also forms the first electrode 68 of the tunable RF component 13.

The tunable RF component 13 and the DC blocking capacitor 14 are parallel plate capacitors and have a common plate. The common plate is connected to the driver terminal 18. The gap 87 which comprises the isolator 80 and the air gap separates the first electrode 68 from the second electrode 69 of the tunable RF component 13. The parasitic capacitors of the tunable RF component 13 are reduced. The third parasitic capacitor 24 couples the first electrode 85 of the DC blocking capacitor 14 to the backside of the substrate 60.

In an alternative, not shown embodiment, the substrate 60 is a semiconductor substrate on which an isolating layer is deposited. Thus, an isolation of the first electrode 85 of the DC blocking capacitor 14 to the substrate 60 is provided.

The lower part of FIG. 13 shows a combination of the cross-sections shown in FIGS. 9 and 13. The first and the second dielectric layer 70, 71 of FIG. 9 are used as isolator 80 and as further isolator 84. Thus, the first conducting line 73 is arranged between the isolator 80 and the further isolator 84. Also, the second conducting line 74 is located between the isolator 80 and the further isolator 84. Openings in the isolator 80 allow an electrical contact to the RF signal terminal 15 and to the fixed voltage terminal 16.

The RF device 11 of FIG. 13 is similar to the RF device 11 of FIG. 12 but with integrated DC decoupling capacitor. The parasitic capacitance is now shifted to the bottom electrode 85 of the DC blocking capacitor 14. The DC blocking capacitor 14 is integrated below the tunable RF component 13 that is a MEMS capacitor. The connection of the bias to the bottom electrode avoids actuation coupling of the anchors through the substrate 60. The anchors of the tunable RF component 13 are structures on the substrate 60 which hold the second electrode 69 above the first electrode 68. The second electrode 69 is the movable electrode and comprises a membrane. The first electrode 68 is the fixed electrode and is designed as backplate. The substrate 60 preferably can be a semiconducting substrate. By co-design of one RF function in one package, the parasitic capacitances can be reduced also in case the bond frame 62 is not grounded.

The invention claimed is:

1. An RF device, comprising:
a substrate; and
a series circuit that includes a tunable RF component and a DC blocking capacitor;
wherein the series circuit is arranged on the substrate;
wherein the tunable RF component is coupled to a RF signal terminal and the DC blocking capacitor is coupled to a fixed voltage terminal such that the series circuit is coupled between the RF signal terminal and the fixed voltage terminal in such a way that the fixed voltage terminal is electrically isolated from the RF signal terminal with respect to a DC current;
a cap at least partially covering a first surface of the substrate;
a bond frame that couples the cap to the substrate;
a cavity between the first surface of the substrate and the cap; and
a first feed-through having a first conducting line that electrically connects the series circuit to the RF signal terminal and is electrically isolated from the bond frame,
wherein the tunable RF component is coupled to a driver terminal, and
wherein the fixed voltage terminal is electrically and physically coupled to the bond frame.

2. The RF device according to claim 1, wherein a reference potential terminal is coupled to the RF signal terminal and to the fixed voltage terminal such that the RF signal terminal and the fixed voltage terminal are DC grounded.

3. The RF device according to claim 1, wherein the substrate comprises a semiconductor substrate.

4. The RF device according to claim 1, wherein the tunable RF component is directly connected to the RF signal terminal, which is arranged on the substrate and wherein the DC blocking capacitor is directly connected to the fixed voltage terminal, which is arranged on the substrate.

5. The RF device according to claim 1, wherein the tunable RF component comprises a component selected from the group consisting of a varactor diode, a PIN diode, a MEMS capacitor, a capacitor with a tunable dielectric layer, a galvanic MEMS component and a pHEMT.

6. The RF device according to claim 1, wherein the tunable RF component has a first terminal having a first parasitic capacitor and a second terminal having a second parasitic capacitor that has a larger capacitance value than the first parasitic capacitor and wherein the tunable RF component is arranged such that the second terminal of the tunable RF component is connected to the DC blocking capacitor.

7. A system, comprising:
the RF device according to claim 1; and
an antenna coupled to the RF signal terminal.

8. A method for tuning an RF device having a substrate, a cap at least partially covering a first surface of the substrate, a bond frame that couples the cap to the substrate, and a cavity between the first surface of the substrate and the cap, the method comprising:
providing an RF input signal that is DC grounded to an RF signal terminal;
providing a ground potential to a fixed voltage terminal, wherein a series circuit of a tunable RF component and a DC blocking capacitor is arranged on the substrate and is coupled between the RF signal terminal and the fixed voltage terminal in such a way that the fixed voltage terminal is electrically isolated from the RF signal terminal such that the tunable RF component is coupled to the RF signal terminal and the DC blocking capacitor is coupled to the fixed voltage terminal; and providing a driver signal that controls the tunable RF component, wherein the RF signal terminal is connected to the series circuit through a feed-through having a first conducting line that electrically connects the series circuit to the RF signal terminal and is electrically isolated from the bond frame, and wherein the fixed voltage terminal is electrically and physically coupled to the bond frame.

* * * * *